United States Patent
Meloni et al.

(10) Patent No.: US 7,316,791 B2
(45) Date of Patent: Jan. 8, 2008

(54) POLYIMIDE BASED SUBSTRATE COMPRISING DOPED POLYANILINE

(75) Inventors: Paul Arthur Meloni, League City, TX (US); Bernhard Wessling, Bargteheide (DE); Brian C. Auman, Pickerington, OH (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 404 days.

(21) Appl. No.: 10/748,940

(22) Filed: Dec. 30, 2003

(65) Prior Publication Data

US 2005/0145832 A1 Jul. 7, 2005

(51) Int. Cl.
*H01B 1/20* (2006.01)
*G03G 15/01* (2006.01)
*B32B 33/00* (2006.01)

(52) U.S. Cl. .................. 252/500; 399/302; 430/48; 428/473.5

(58) Field of Classification Search ............... 252/500; 399/302; 430/48; 428/473.5
See application file for complete search history.

(56) References Cited

U.S. PATENT DOCUMENTS

| | | | |
|---|---|---|---|
| 4,582,863 A | 4/1986 | Wessling | |
| 4,925,610 A | 5/1990 | Wessling et al. | |
| 4,929,388 A | 5/1990 | Wessling | |
| 4,935,164 A | 6/1990 | Wessling et al. | |
| 5,069,820 A | 12/1991 | Jen et al. | |
| 5,160,456 A | 11/1992 | Lahn et al. | |
| 5,456,882 A | 10/1995 | Covain | |
| 5,476,612 A | 12/1995 | Wessling et al. | |
| 5,567,355 A | 10/1996 | Wessling et al. | |
| 5,720,903 A | 2/1998 | Wessling et al. | |
| 5,721,056 A | 2/1998 | Wessling | |
| 5,779,818 A | 7/1998 | Wessling | |
| 5,846,606 A | 12/1998 | Wessling | |
| 6,632,380 B1 | 10/2003 | Wessling | |
| 7,130,569 B2 * | 10/2006 | Goodman et al. | 399/302 |
| 2002/0032271 A1 * | 3/2002 | Katashima et al. | 524/495 |
| 2007/0025740 A1 * | 2/2007 | Katoh et al. | 399/1 |

FOREIGN PATENT DOCUMENTS

| | | | |
|---|---|---|---|
| JP | 64-70537 | * | 3/1989 |
| JP | 08-259709 | | 10/1996 |

OTHER PUBLICATIONS

Gary Min, "Conducting Polymers and Their Applications in the Film Industry—Polyaniline/Polyimide Blended Films," Synthetic Metals, 1999, pp. 1163-1166, vol. 2, Elsevier Science S.A.

* cited by examiner

*Primary Examiner*—Mark Kopec

(57) ABSTRACT

The present invention relates to electrically conductive polyimide films having dispersed in them electrically conductive polymer particles having an average particle size from 0.5 to 5.0 microns. These films are suitable as image transfer belts in high-speed color copying machines and possess a surface smoothness, Ra factor (microns), between 0.5 and 1.5 and a gloss factor between 70 and 120.

23 Claims, 1 Drawing Sheet

POLYIMIDE BASED SUBSTRATE COMPRISING DOPED POLYANILINE

BACKGROUND OF THE INVENTION

1. Field of the Invention

The present invention relates generally to polymeric compositions having at least one polyimide domain and at least one doped polyaniline domain. More specifically, the compositions of the present invention can be created by incorporating a stable, doped polyaniline dispersion into a polyamic acid (a polyimide precursor material). The mixture is processed to form a blended polymer substrate (polyimide+doped polyaniline) without having undue gelling or agglomeration of the doped polyaniline particles.

2. Discussion of the Related Art

Polyimide compositions containing electrically conductive doped polyaniline filler particles are known. U.S. Pat. No. 5,567,355, to Wessling et. al., teaches a method of forming a doped polyaniline dispersion having an average particle size of less than 500 nanometers. However, such compositions tend to have low gloss factor and/or a rough surface when used in polyimide blends.

G. Min disclosed procedures for the preparation of polyimide-polyaniline blends in Synth. Met. Vol. 102 (1999), p. 1163-1166, A Solution Blending Method. A solution of un-doped polyaniline (also called "Emeraldine base" or "EB") is prepared in a polar organic solvent (e.g. dimethylacetamide) in which the polyamic acid (polyimide precursor) is also soluble. Then, the two solutions are mixed and the resulting mixture cast and dried. The resulting polyimide-EB blend is subsequently doped using hydrochloric acid or other protonic acid dopants. However, gelation can be problematic for this type of process, particularly when manufacturing and storing the polyaniline (EB) solutions.

BRIEF SUMMARY OF THE INVENTION

Figure 1:
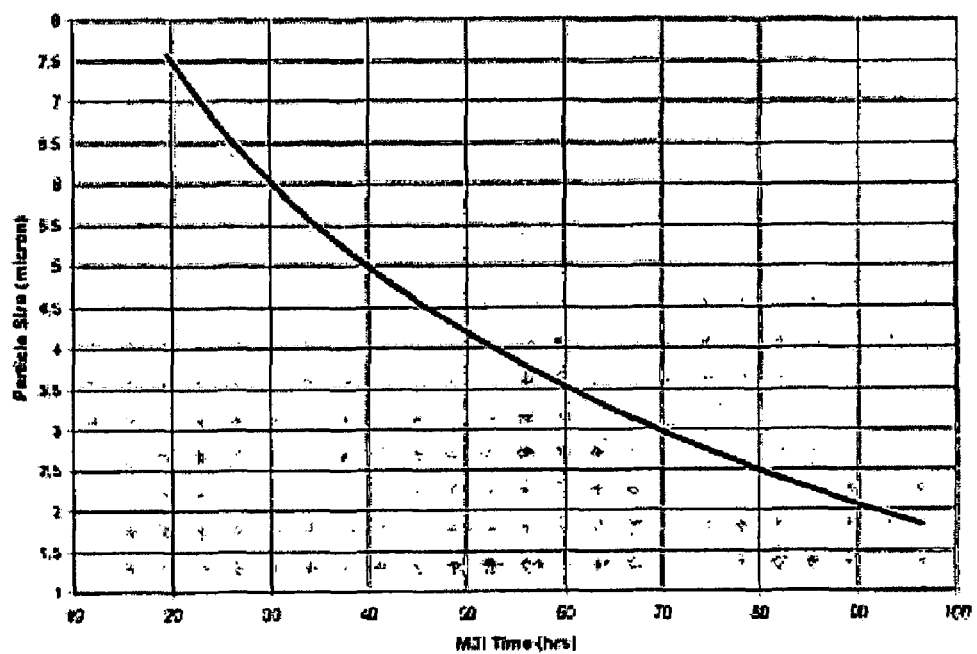
FIG. 1 discloses the relationship between average particle size vs. Mill time (hrs).

The present invention is directed to stable (or substantially stable), polyaniline dispersions (or suspensions) in a polar organic (or similar-type) solvent. Preferably, at least a majority of the polyaniline domains are doped with a doping agent or similar type composition.

The term "polyaniline" is intended to mean an oligomeric or polymeric composition made from aniline by (usually oxidative) polymerization or alternatively, any other derivative of aniline comprising alkyl, alkoxy, and derivatives thereof.

Polyaniline generally occurs in several forms or compositions, but only about one is conductive. The conductive form is often called "Emeraldine salt" and is a protonated ("doped") form of the un-doped, non-conductive so-called "Emeraldine base" polyaniline. In addition, polyaniline can be reduced (and then later re-oxidized) whereby the fully reduced form is called "leucoEmeraldine" polyaniline. The partially oxidized form of polyaniline is called "nigraniline", and the fully oxidized form of polyaniline "pernigraniline". For purpose of doping the polyaniline, protonic and Lewis acids are suitable and will be described later.

In one embodiment of the present invention, a polyimide-based film is provided, having doped polyaniline particles uniformly dispersed therein.

In such an embodiment, the average particle size (of the doped polyaniline particle in the polyimide base matrix) is preferably from about 0.5 microns to (up to) about 5 microns.

In another embodiment, the polyimide based films of the present invention can comprise doped, electrically conductive polyaniline particles having an average particle size between and including any two of the following: 0.5, 0.6, 0.7, 0.8, 0.9, 1.0, 2.0, 3.0, 4.0, and up to (but not including) 5 microns. During polyamic acid processing (a solution to ultimately obtain a polyimide base matrix) a substantially stable doped polyaniline dispersion can be injected and mixed into the polyamic acid.

Generally, the polyaniline particles are thus uniformly dispersed (or substantially uniformly dispersed) in the polyimide base matrix.

In one embodiment, films of the present invention have a gloss factor between and including any two of the following: 70, 75, 80, 85, 90, 95, 100, 105, 110, 115 and 120 and often have a relatively smooth surface where the roughness Ra (microns) number is between and including any two of the following: 0.05, 0.06, 0.07, 0.08, 0.09, 0.10, 0.11, 0.12, 0.13, 0.14 and 0.15.

In one embodiment, the films of the present invention are (largely or completely) devoid of surface imperfections by not having a significant number of small gel particles in the film. Thus, these films are often suitable in imaging-type applications such as an image transfer substrate in a high-speed photocopying machine.

In another embodiment of the present invention, the process for preparing the electrically conductive polyimide blend film includes one or more of the following:

(1) polyaniline (in Emeraldine base form) particles dispersed in a polar solvent,
(2) polyaniline particles doped with a doping agent (optionally in water or another solvent), which will cause the formation of bigger particles,
(3) doped polyaniline particles ground from an average particle size of about 20 to 200 microns to an average particle size of from 0.5 microns to 5 microns,
(4) doped polyaniline particles dispersed in a selected dispersion medium are injected into a flowable polyimide precursor material (i.e. a polyamic acid) and mixed,
(5) intermixed, doped polyaniline particles and polyamic acid being cast and heated into a semi-cured polyamic acid sheet, and/or
(6) interspersed (doped polyaniline) particles in a polyimide (or polyimide precursor) sheet, cured to form an electrically conductive polyimide substrate.

DETAILED DESCRIPTION OF THE PREFERRED EMBODIMENT(S)

Generally, the electrically conductive blend films of the present invention comprise two different polymer types. The first polymer is a non-electrically conductive base polymer, typically a polyimide derived from a polyamic acid. The second polymer is a doped polyaniline or similar type electrically conductive polymer. The composition of the present invention can optionally include other electrically conductive fillers like carbon or metal particles.

The embodiments of the present invention can be designed to provide any one of a number of useful properties typical of a polyimide, while also being electrically conductive. Advantageous properties associated with the films of the present invention can include:

(1) an electrical resistivity between (and including) any two of the following, 10,000, $10^5$, $10^6$, $10^7$, $10^8$, $10^9$, $10^{10}$, $10^{11}$, $10^{12}$, $10^{13}$, and $10^{14}$ ohms per square,
(2) a gloss factor (at an 85 degree angle) between (and including) any two of the following, 70, 75, 80, 85, 90, 95, 100, 105, 110, 115, and 120,
(3) a surface roughness between (and including) any two of the following, 0.05, 0.06, 0.07, 0.08, 0.09, 0.10, 0.11, 0.12, 0.13, 0.14 and 0.15, and
(4) a thickness between (and including) any two of the following, 5, 8, 10, 15, 20, 25, 30, 35, 40, 45, 50, 55, 60, 65, 70, 75, 80, 85, 90, 95, 100, 105, 110, 115, 120, and 125 microns.

The present invention is directed to films made by dispersing electrically conductive polymers (i.e. doped polyaniline) into a polyimide precursor (e.g. a polyamic acid) to form an electrically conductive film.

In one embodiment, films of the present invention can often be exposed to voltages between and including 50, 100, 500, 1000, 1500, 2000, 2500, 3000, 3500, 4000, 4500, and 5000 volts for extended time intervals, e.g. a time period of at least 0.01, 0.1, 0.5, 1, 2, 5, 10, 20 or 30 minutes, without undue change in surface resistivity (and volume resistivity). In comparison, many conventional conductive films tend to drift in a negative direction (i.e. the film will become more electrical conductivity over time) as voltage is applied.

The conductive polyimide/polyaniline films of the present invention will generally have one or more of the following properties:
(I) a relatively constant resistivity over different voltages, exposure times, operating temperatures (from 0 to 45° C.), and operating humidity fluctuations (typically, ranging from 10 to 85 percent),
(II) a smooth film surface where the gloss factor is between 70 and 120, and
(III) a smooth film surface where the surface roughness, Ra factor (microns), is between 0.05 and 0.15.

Doped (or un-doped) polyaniline dispersions in solvents commonly used to make polyimides, can tend to gel (either partially or totally) if the average particle size of the polyaniline particle is too small. If the average particle size of the polyaniline particles is too large, the dispersion can flocculate and larger particles can settle.

Applicant has surprisingly discovered that there exists a range of particle sizes where polyaniline slurries can generally be made to be stable (relatively low levels of unwanted gelling, if any). This is true when the polyaniline particles are doped with an acid, and oftentimes to a somewhat lesser degree, if the polyaniline particles are un-doped. In the case of polyaniline particles dispersed in dimethylacetamide solvent (a solvent commonly used to make polyimides), the particles must generally have an average particle size in a range between any two of the following numbers: 0.5, 0.6, 0.7, 0.8, 0.9, 1.0, 2.0, 3.0, 4.0 and up to but not including 5 microns.

If the average particle size of the polyaniline particles is less than 0.5 microns, the surface energy (and surface area) of the doped electrically conductive polyaniline particles can often be incompatible with the other slurry components resulting in unwanted gelling of the slurry. These (less than 0.5 micron) slurries, under normal agitation (and in some cases under a moderate amount of shearing force) are generally not stable and will often gel over time, especially if made in solvents commonly used to manufacture polyimides. The polyimide blend films made from these polyaniline dispersions can have a high number of surface defects, undesirable high surface roughness, and low surface gloss factor (i.e. have a matte finish).

Regarding embodiments of the present invention involving polyaniline particles dispersed in dimethylacetamide (a typical solvent used in the manufacture of polyimides) when the average particle sizes is below 0.5 microns, the particles may have too high a surface area and/or surface energy to form a stable dispersion. This can be especially evident when the polyaniline dispersion is at a concentration greater than 1.0, 2.0, 3.0, 4.0, 5.0, 6.0, or 7.0 weight percent in dimethylacetamide solvent.

"Gelling" as used herein is intended to mean that the average particle size of the doped polyaniline particles increases to greater than 5, 8, 10, 12, 15, 17, 18, 19 or 20 microns. The present invention is generally free of unwanted gelling that often results in the size of the average polyaniline particle becoming so large that filtering the dispersion (or the mixed polymer blend) is impractical or impossible.

If the average particle size of the doped polyaniline particle is greater than 5 microns, often the larger particles will tend to agglomerate (i.e. aggregate with other large and small particles) to form even larger agglomerates that precipitate. Agglomeration rates have been observed to be somewhat slower than gelling rates, but the result in the blend films formed therefrom is generally the same. Films made from these slurries will oftentimes have high surface roughness and a large number of surface defects (commonly seen as 'bumps' on the surface of the film).

In other cases, when polyaniline powder properties are less than optimal (e.g. very high molecular weight or a high degree of impurities present in the polyaniline) preparing a stable polyaniline dispersion, having from one to 5 weight percent solids, can be problematic. The present invention surprisingly shows that a wider range of commercially available polyaniline powders (i.e. powders that contain impurities) are now viable as starting materials to make polyimide/polyaniline blend films. It has been discovered that by controlling the average particle size distribution of the polyaniline slurry, an advantageous method of making a stable slurry, irrespective of the molecular weight of the polyaniline or the impurity content, has been discovered.

The preparation of such dispersions with a medium range of particle size (in a range of about 0.5 μm to about 5.0 μm) requires a controlled procedure. Two preferred approaches (including derivations and modifications thereof) can be used within the scope of this invention:
a) The solution or ultra-fine dispersion of an un-doped form of polyaniline (the Emeraldine base) is prepared in a suitable solvent, optionally followed by the addition of a weak dispersion medium. This causes the formation of bigger particles that are then ground to the particle size range as needed. Doping of the Emeraldine base dispersion could be performed either in parallel to the addition of the non-solvent/weak dispersion medium or could be performed after this step. In addition, doping could be done prior to or after the grinding step. Doping may also be done with the mixing of the polyaniline dispersion with the polyamic precursor solution. It is often preferred to use solvents that are miscible with the polyamic acid.
b) The Emeraldine base slurry (suspension) in any solvent can be doped, and, if necessary dried to a moisture level, or solvent level, that is appropriate to make a polyimide. Then, the pre-doped polyaniline dispersion, in the selected solvent medium can be mixed with a solvent appropriate to make a polyimide (e.g. dimethylacetamide) and then mixed with a polyimide precursor (e.g. a polyamic acid solution).

In one embodiment of the present invention, a stable polyaniline slurry is formed by first dispersing un-doped polyaniline (Emeraldine base) particles in a polar solvent under high shear. After the initial particles are dispersed, a dopant (dissolved in water) is added whereby the non-solvent/weak dispersion medium (respectively) is introduced. The slurry is then milled through a particle-size reduction media so that the final average particle size of the polyaniline particles is reduced to from about 20 to 200 microns to a range of about 0.5 microns to (up to) 5.0 microns.

When the average particle size of the doped polyaniline particles in the liquid dispersion is from 0.5 microns to (up to) 5 microns, the slurry is generally stable over time (particularly under moderate agitation in a feed tank or otherwise). Generally under such conditions, the average particle size (of the dispersion) does not change significantly (i.e. increase to an average particle size of 5.0 microns or more) at least for a period of time (typically at least seven days or more).

The polyimide/polyaniline blend film formed from these dispersions generally has a smooth surface only and few defects (which are tolerable so long as they are within acceptable technical specifications) compared to a film made from slurries where the average particle size is outside the range of from 0.5 microns to 5.0 microns (or any sub-range thereto). The films made according to the following invention are ideal for use as an image transfer belt or a substrate in a flexible circuit package.

In one embodiment of the present invention, blend films can be obtained by dispersing pre-doped or un-doped polyaniline particles in dimethylacetamide (DMAc). When using an un-doped polyaniline, generally the particles can be doped by adding a doping agent to the liquid dispersion. Doping may also be performed in situ by adding the doping agent after the polyaniline particles are mixed with the polyamic acid (or at the same time, the polyaniline particles are mixed with the polyamic acid). Generally, the doping of the polyaniline may be performed before (or after) the polyaniline particle size reduction.

For films of the present invention, doping of the polyaniline particles may be performed at less than 100 percent doping. Doping generally requires that an acid group associate with the conjugated moiety of the polyaniline molecular chain. By chemical association of the acid to the polyaniline chain, the polyaniline chain is made to be electrically conductive. However, not every conjugated moiety of the polyaniline chain must have an acid associated group. In some cases, the polyaniline chain may be doped with 1, 3, 5, 10, 15, 20, 30, 40, 50, 60, 70, 80, 90 or 99 percent dopant. If less than 100 percent dopant is used, typically more polyaniline concentration in the polyimide blend film is required to reach a target resistivity.

The films of the present invention can be produced by first doping a polyaniline powder in the presence of an organic solvent to form an electrically conductive, polyaniline particle dispersion. The initial liquid dispersions formed are typically too large to be injected directly into a polyamic acid. These slurries typically have an average particle size between 20 and 200 microns and are generally unstable over time (i.e. will gel or agglomerate).

Oftentimes it is important to reduce the average particle size of the polyaniline particles after the initial dispersion has been prepared. As used herein the term "target particle size distribution" is intended to mean a polyaniline liquid dispersion having an average particle size from 0.5, 0.6, 0.7, 0.8, 0.9, 1.0, 2.0, 3.0, 4.0, and (up to) 5 microns. When using a pre-doped polyaniline powder, the doping step is typically eliminated. However, compositions of the present invention, can be derived from polyaniline dispersions using (i) pre-doped polyaniline (ii) un-doped polyaniline (and then doping it in situ), or (iii) un-doped polyaniline and never doping it. The dispersion can be ground to the target particle size distribution (in an environment of shearing force) so that the dispersion reaches an average particle size range from 0.5, 0.6, 0.7, 0.8, 0.9, 1.0, 2.0, 3.0, 4.0, and 5 microns.

A protic acid can be used as the dopant for the polyaniline, particularly useful protic acids are acids with an acid dissociation constants (pKa) of 4.8 or lower. Examples of such acids include sulfuric acid, nitric acid, phosphoric acid, hypophosphoric or phosphonic acids, hydrofluoroboric acid, hydrofluorophosphoric acid, and hydrochloric acid. Other useful acids (as dopants) include aliphatic acids, aromatic acids, alicyclic acids, and polybasic acids. These organic acids can also have hydroxyl groups, halogens, nitrile groups, cyano groups, and amino groups. Other less common, but useful acids include acetic acid, n-butyric acid, pentadecafluorooctanoic acid, pentafluoro-acetic acid, trifluoroacetic acid, trichloroacetic acid, dichloroacetic acid, monofluoroacetic acid, monobromoacetic acid, monochloroacetic acid, cyanoacetic acid, acetyl acetic acid, nitroacetic acid, triphenyl acetic acid, formic acid, oxalic acid, benzoic acid, m-bromo-benzoic acid, p-chlorobenzoic acid, m-chlorobenzoic acid, p-chlorobenzoic acid, o-nitrobenzoic acid, 2,4-dinitrobenzoic acid, 3,5-dinitrobenzoic acid, picric acid, o-chlorobenzoic acid, p-nitrobenzoic acid, m-nitrobenzoic acid, trimethyl benzoic acid, p-cyanobenzoic acid, m-cyanobenzoic acid, thymol blue, salicylic acid, 5-amino salicylic acid, o-methoxy benzoic acid, 1,6-dinitro-4-chlorophenol, 2,6-dinitrophenol, 2,4-dinitrophenol, p-oxybenzoic acid, bromophenol blue, mandelic acid, phthalic acid, isophthalic acid, maleic acid, fumaric acid, malonic acid, tartaric acid, citric acid, lactic acid, succinic acid, glycine, glycolic acid, thioglycolic acid, ethylene diamine-N,N'-diacetic acid, and ethylene diamine N,N,N',N'-tetracetic acid.

Moreover, useful acids can have sulfonic acid or sulfuric acid groups. Examples of such acids are amino naphthol sulfonic acid, metanilic acid, sulfanilic acid, allyl sulfonic acid, lauryl sulfuric acid, xylene sulfonic acid, chlorobenzene sulfonic acid, methane sulfonic acid, ethane sulfonic acid, 1-propane sulfonic acid, 1-butane sulfonic acid, 1-hexane sulfonic acid, 1-heptane sulfonic acid, 1-octane sulfonic acid, 1-nonane sulfonic acid, 1-decane sulfonic acid, 1-dodecane sulfonic acid, benzenesulfonic acid, styrene sulfonic acid, p-toluene sulfonic acid, naphthalene sulfonic acid, ethyl benzenesulfonic acid, propyl benzenesulfonic acid, butyl benzenesulfonic acid, pentyl benzenesulfonic acid, hexyl benzenesulfonic acid, heptyl benzenesulfonic acid, octyl benzenesulfonic acid, nonyl benzenesulfonic acid, decyl benzenesulfonic acid, undecyl benzenesulfonic acid, dodecyl benzenesulfonic acid, pentadecyl sulfonic acid, octadecyl benzenesulfonic acid, diethyl benzenesulfonic acid, dipropyl benzenesulfonic acid, dibutyl benzenesulfonic acid, methyl naphthalene sulonic acid, ethyl naphthalene sulfonic acid, propyl naphthalene sulfonic acid, butyl naphthalene sulfonic acid, phentyl naphthalene sulfonic acid, hexyl naphthalene sulfonic acid, heptyl naphthalene sulfonic acid, octyl naphthalene sulfonic acid, nonyl naphthalene sulfonic acid, pentadecyl naphthalene sulfonic acid, octydecyl naphthalene sulfonic acid, dimethyl naphthalene sulfonic acid, diethyl naphthalene sulfonic acid, dipropyl naphthalene sulfonic acid, dibutyl naphthalene sulfonic acid, dipentyl naphthalene sulfonic acid, dihexyl naphthalene sulfonic acid, diheptyl naphthalene sulfonic acid, dioctyl naphthalene sulfonic acid, dinonyl naphthalene sulfonic acid, timethyl naphthalene sulfonic acid, triethyl naphthalene sulfonic acid, tripropyl napohthalene sulfonic acid, tributyl naphthalene sulfonic acid, camphor sulfonic acid, and acrylamide-t-butyl sulfonic acid.

In the case of dispersing leucoEmeraldine based polyaniline (a chemically reduced polyaniline having protons donated to it by a strong reducing agent), the leucoEmeraldine based polyaniline particles generally can be relatively small. These polyaniline particles have an average particle size in the range of 5 to 50 nanometers. In the case of producing a polyaniline dispersion in DMAc, the leuco-based polyaniline (in the presence of dopant or not in the presence of a dopant) can gel in a matter of hours.

Phenyl hydrazine, hydrazine, hydrazine hydrate, hydrazine sulfate, hydrazine chloride, and other hydrazine compounds, or reducing hydrogenated metal compounds, such as lithium aluminum hydride, and lithium borohydride, may be used as reducing agents. A residue generally does not form after the reduction reaction and therefore hydrazine hydrate or phenyl hydrazine is often preferred as a reducing agent.

In one embodiment of the present invention, useful solvents are used to process the polyimide component and the polyaniline component. These solvents include (normally liquid) N,N'-dialkylcarboxylamides and the lower molecular weight members of carboxylamides, particularly N,N'-dimethylformamide and N,N'-dimethylacetamide. Still other useful compounds of this class of solvents include N,N'-diethylformamide and N,N'-diethylacetamide. Other solvents that may be useful include dimethylsulfoxide, N-methyl-2-pyrrolidone, N-cyclohexyl-2-pyrrolidone, tetramethyl urea, gamma-butyrolactone, dimethylsulfone, hexamethylphosphoramide, tetramethylenesulfone, diglyme, pyridine and the like. The solvents listed above can be used alone, in combinations with one another solvent, or in combinations with other solvents such as toluene, xylene, benzonitrile, and dioxane.

In another embodiment of the present invention, useful solvents are characterized by their surface tension. In this embodiment, the surface tension of these useful solvents is between any two of the following numbers, 34, 35, 36, 37, 38, 39, 40, 41 or 42 mN/m. These solvents may be used alone or in combination with weak dispersion mediums.

As used herein the term "weak dispersion mediums" describes a liquid that has a surface tension between (and including) any two of the following numbers, 20, 21, 22, 23, 24, 25, 26, 27, 28, 29, 30, 31, 32, 33, or 33.5 mN/m or between (and including) any two of the following numbers, 42, 45, 50, 55, 60, 65, 70, 75, 80, 85, 90, 95, 100, 125, 150, 200, 300, 400, and 500 mN/m. Weak dispersion mediums include, but are not limited to, alcohols, ethers, ketones and water. It is important to note that water (or any other useful solvent or weak dispersion medium) may not be used to such an extent that it would inhibit, or act as a chain terminator, of the polyamic acid polymerization reaction.

In one embodiment of the present invention, a weak dispersion medium is used in combination with a useful solvent. A weak dispersion medium is generally added to a polyaniline dispersion (e.g. a leucoEmeraldine base polyaniline) to increase the average particle size of the polyaniline particles. For example, when the average particle size of the polyaniline particles is below 500 nanometers a weak dispersion medium can be added to increase the particle size of the polyaniline particles to the target particle size distribution. Generally speaking, weak dispersion mediums are miscible with the useful solvents mentioned above.

In accordance with the present invention, polyaniline liquid dispersions having an average particle size larger than 5.0 microns are ground to a smaller average particle size. This is done using any known (conventional or non-conventional) means of particle size reduction including kinetic dispersion (using a rotor/stator assembly at high revolution), ultra-sonic wave methods, media milling (in either a continuous media mill or batch media mill), or the like.

The most common means of particle size reduction is by mechanical grinding (or the mechanical manipulation of) the subject particles using fine media stirred under low shear over long periods. When using a fine media to reduce the average particle size of the particles in the slurry, the slurry can be pumped from a high shear environment through a horizontal media mill. The media in the mill (beads of zirconium, yttrium, or the like) can be agitated by turning rotors. The moving media (media rubbing against other media) generally causes the shearing force to grind the particles of the slurry as the slurry is pumped through the mill. Once the target particle size distribution of the slurry is reached, the slurry will then generally be stable enough (especially at concentrations from one to 15 weight percent) to be stored under slow agitation.

In one embodiment of the present invention, the milling (or grinding) of the doped polyaniline particle dispersion is performed in a horizontal media mill. The average particle size of the doped polyaniline particle is reduced from 20 to 200 microns to about 0.5 microns to 5 microns in about twenty-four to seventy-two hours. When the average particle size of the dispersion reaches the range of from 0.5 to 5.0 microns, the doped polyaniline dispersion is stable over time in the polar solvents.

In another embodiment, the doped polyaniline dispersions typically have a solids weight percent in a solvent ranging between 1, 2, 3, 4, 5, 6, 7, 8, 9, 10, 11, 12, 13, 14, 15, 16, 17, 18, 19, 20, 22, 24, 26, 28, and 30 weight percent.

The term "stable doped polyaniline particle dispersion" is intended to mean a polyaniline particle dispersion where the average particle size is from 0.5, 0.6, 0.7, 0.8, 0.9, 1.0, 2.0, 3.0, 4.0, and 5 microns and where the dispersion will not change its average particle size by more than 10, 20, 40, 60, 80, 100, 150, 200, 300, 400, 500 or 1000 percent of its original value over a 4, 6, 8, 12, 16, 20, 24, 48, 72, 96, or 120 hour period.

In one embodiment, the doped polyaniline particle dispersions mentioned above are next injected into a polyimide precursor (commonly a polyamic acid). The two components are mixed under high shear to form a mixed polymer blend. The mixed polymer blend may be further filtered or degassed to remove larger unwanted particles or unwanted gasses. The polyamic acid can be an aromatic polyamic acid prepared by copolymerizing substantially equimolar amounts of an aromatic tetracarboxylic dianhydride (or the dianhydride's acid, acid ester, or acid halide ester derivative) with an aromatic diamine component. In one example, the dianhydride component is 3,3',4,4'-biphenyltetracarboxylic dianhydride (i.e. 3,3',4,4'-BPDA) optionally blended with pyromellitic dianhydride (PMDA). In this same embodiment, the diamine component is p-phenylenediamine (PPD) optionally blended with a diaminodiphenyl ether like 3,4'-oxydianiline (3,4'-ODA) or 4,4'-oxydianiline (4,4'-ODA). The dianhydrides first may be blended together or added individually to either one, or blended with all of the diamines to form a polyamic acid polymer that is either a block (segmented) copolymer or a random copolymer.

Examples of suitable tetracarboxylic dianhydrides (and functional derivatives thereof) that are useful in accordance with this embodiment of the present invention include:
1. pyromellitic dianhydride (PMDA);
2. 3,3',4,4'-biphenyl tetracarboxylic dianhydride (BPDA);
3. 3,3',4,4'-benzophenone tetracarboxylic dianhydride (BTDA);
4. 4,4'-oxydiphthalic anhydride (ODPA);
5. bis(3,4-dicarboxyphenyl) sulfone dianhydride (DSDA);
6. 2,2-bis(3,4-dicarboxyphenyl) 1,1,1,3,3,3,-hexafluoropropane dianhydride (6FDA);
7. 2,2'-bis[4-(3,4-dicarboxyphenoxy)phenyl]propane dianhydride (BPADA);
8. 2,3,6,7-naphthalene tetracarboxylic dianhydride;
9. 1,2,5,6-naphthalene tetracarboxylic dianhydride;
10. 1,4,5,8-naphthalene tetracarboxylic dianhydride;
11. 2,6-dichloronaphthalene-1,4,5,8-tetracarboxylic dianhydride;
12. 2,7-dichloronaphthalene-1,4,5,8-tetracarboxylic dianhydride;
13. 2,3,3',4'-biphenyl tetracarboxylic dianhydride;
14. 2,2',3,3'-biphenyl tetracarboxylic dianhydride;
15. 2,3,3',4'-benzophenone tetracarboxylic dianhydride;
16. 2,2',3,3'-benzophenone tetracarboxylic dianhydride;
17. 2,2-bis(3,4-dicarboxyphenyl) propane dianhydride;
18. 1,1-bis(2,3-dicarboxyphenyl) ethane dianhydride;
19. 1,1-bis(3,4-dicarboxyphenyl) ethane dianhydride;
20. bis(2,3-dicarboxyphenyl) methane dianhydride;
21. bis(3,4-dicarboxyphenyl) methane dianhydride;
22. 4,4'-(hexafluoroisopropylidene) diphthalic anhydride
23. bis(3,4-dicarboxyphenyl) sulfoxide dianhydride;
24. tetrahydrofuran-2,3,4,5-tetracarboxylic dianhydride;
25. pyrazine-2,3,5,6-tetracarboxylic dianhydride;
26. thiophene-2,3,4,5-tetracarboxylic dianhydride;
27. phenanthrene-1,8,9,10-tetracarboxylic dianhydride;
28. perylene-3,4,9,10-tetracarboxylic dianhydride;
29. bis-1,3-isobenzofurandione;
30. bis-(3,4-dicarboxyphenyl) thioether dianhydride;
31. bicyclo-[2,2,2]-octen-(7)-2,3,5,6-tetracarboxylic-2,3,5,6-dianhydride;
32. 2-(3',4'-dicarboxyphenyl) 5,6-dicarboxybenzimidazole dianhydride;
33. 2-(3',4'-dicarboxyphenyl) 5,6-d icarboxybenzoxazole d ian hydride;
34. 2-(3',4'-dicarboxyphenyl) 5,6-d icarboxybenzothiazole d ian hydride;
35. bis (3,4-dicarboxyphenyl) 2,5-oxadiazole 1,3,4-dianhydride;
36. bis-2,5-(3',4'-dicarboxydiphenylether) 1,3,4-oxadiazole dianhyd ride;
37. their acid ester and acid halide ester derivatives;
38. and the like.

Representative dianhydrides which are particularly preferred in the present invention include pyromellitic dianhydride (PMDA), 4,4'-oxydiphthalic anhydride (ODPA), bis (3,4-dicarboxyphenyl) sulfone dianhydride, 2,2-bis(3,4-dicarboxyphenyl) 1,1,1,3,3,3,-hexafluoropropane dianhydride (6FDA), 2,2'-bis[4-(3,4-dicarboxyphenoxy)phenyl]propane dianhydride, 3,3',4,4'-benzophenonetetracarboxylic dianhydride (BTDA), bis(3,4-dicarboxyphenyl) sulfone dianhydride (DSDA), 2,2'-bis[4-(3,4-dicarboxyphenoxy)phenyl]propane dianhydride (BPADA) and 3,3',4,4'-biphenyltetracarboxylic dianhydride (BPDA).

Examples of suitable aromatic diamines (and functional derivatives thereof) useful in accordance with this embodiment of the present invention include:

1 2,2 bis-(4-aminophenyl) propane;
2. 4,4'-diaminodiphenyl methane;
3. 4,4'-diaminodiphenyl sulfide;
4. 3,3'-diaminodiphenyl sulfone;
5. 4,4'-diaminodiphenyl sulfone;
6. 4,4'-diaminodiphenyl ether (4,4'-ODA);
7. 3,4'-diaminodiphenyl ether (3,4'-ODA);
8. 1,3-bis-(4-aminophenoxy) benzene (APB-134 or RODA);
9. 1,3-bis-(3-aminophenoxy) benzene (APB-133);
10. 1,2-bis-(4-aminophenoxy) benzene;
11. 1,2-bis-(3-aminophenoxy) benzene;
12. 1,4-bis-(4-aminophenoxy) benzene;
13. 1,4-bis-(3-aminophenoxy) benzene;
14. 1,5-diaminonaphthalene;
15. 2,2'-bis(trifluoromethyl)benzidine (TFMB);
16. 4,4'-diaminodiphenyldiethylsilane;
17. 4,4'-diaminodiphenylsilane;
18. 4,4'-diaminodiphenylethylphosphine oxide;
19. 4,4'-diaminodiphenyl-N-methyl amine;
20. 4,4'-diaminodiphenyl-N-phenyl amine;
21. 1,2-diaminobenzene (OPD);
22. 1,3-diaminobenzene (MPD);
23. 1,4-diaminobenzene (PPD);
24. 2,5-dimethyl-1,4-diaminobenzene;
25. 2,5-dimethyl-1,4-phenylenediamine (DPX);
26. trifluoromethyl-2,4-diaminobenzene;
27. trifluoromethyl-3,5-diaminobenzene;
28. 2,2-bis(4-aminophenyl) 1,1,1,3,3,3-hexafluoropropane (6F diamine);
29. 2,2-bis(3-aminophenyl) 1,1,1,3,3,3-hexafluoropropane;
30. benzidine;
31. 4,4'-diaminobenzophenone;
32. 3,4'-diaminobenzophenone;
33. 3,3'-diaminobenzophenone;
34. m-xylylene diamine;
35. p-xylylene diamine;
36. bisaminophenoxyphenylsulfone;
37. 4,4'-isopropylidenedianiline;
38. N,N-bis-(4-aminophenyl) methylamine;
39. N,N-bis-(4-aminophenyl) aniline
40. 3,3'-dimethyl4,4'-diaminobiphenyl;
41. 4-aminophenyl-3-aminobenzoate;
42. 2,4-diaminotoluene;
43. 2,5-diaminotoluene;
44. 2,6-diaminotoluene;
45. 2,4-diamine-5-chlorotoluene;
46. 2,4-diamine-6-chlorotoluene;
47. 2,4-bis-(beta-amino-t-butyl) toluene;
48. bis-(p-beta-amino-t-butyl phenyl) ether;
49. p-bis-2-(2-methyl-4-aminopentyl) benzene;
50. 1-(4-aminophenoxy)-3-(3-aminophenoxy) benzene;
51. 1-(4-aminophenoxy)-4-(3-aminophenoxy) benzene;
52. 2,2-bis-[4-(4-aminophenoxy)phenyl]propane (BAPP);
53. bis-(4-(4-aminophenoxy)phenyl sulfone (BAPS);
54. 4,4'-bis(3-aminophenoxy)diphenylsulfone (m-BAPS);
55. 4,4'-bis-(aminophenoxy)biphenyl (BAPB);
56. bis(4-[4-aminophenoxy]phenyl) ether (BAPE);
57. 2,2'-bis-(4-phenoxy aniline) isopropylidene;
58. 2,4,6-trimethyl-1,3-diaminobenzene;
59. 4,4'-diamino-2,2'-trifluoromethyl diphenyloxide;
60. 3,3'-diamino-5,5'-trifluoromethyl diphenyloxide;
61. 4,4'-trifluoromethyl-2,2'-diaminobiphenyl;
62. 4,4'-oxy-bis-[(2-trifluoromethyl) benzene amine];

63. 4,4'-oxy-bis-[(3-trifluoromethyl) benzene amine];
64. 4,4'-thio-bis-[(2-trifluoromethyl) benzene-amine];
65. 4,4'-thiobis-[(3-trifluoromethyl) benzene amine];
66. 4,4'-sulfoxyl-bis-[(2-trifluoromethyl) benzene amine];
67. 4,4'-sulfoxyl-bis-[(3-trifluoromethyl) benzene amine];
68. 4,4'-keto-bis-[(2-trifluoromethyl) benzene amine];
69. and the like.

In one embodiment, preferred aromatic diamines include 1,4-diaminobenzene (PPD), 1,3-diaminobenzene (MPD), 4,4'-diaminodiphenyl ether (4,4'-ODA), 3,4'-diaminodiphenyl ether (3,4'-ODA), 1,3-bis-(4-aminophenoxy) benzene (APB-134), 1,3-bis-(3-aminophenoxy) benzene (APB-133), 2,2-bis-[4-(4-aminophenoxy)phenyl]propane (BAPP), bis-(4-(4-aminophenoxy)phenyl sulfone (BAPS), 4,4'-bis(3-aminophenoxy)diphenylsulfone (m-BAPS), 4,4'-bis-(aminophenoxy)biphenyl (BAPB), bis(4-[4-aminophenoxy] phenyl) ether (BAPE), 2,2'-bis(trifluoromethyl)benzidine (TFMB), and 2,2-bis-(4-aminophenyl) 1,1,1,3,3-hexafluoro propane (6F diamine).

Aliphatic and cycloaliphatic diamines are also useful diamine monomers (typically as co-diamines), useful in making the polyamic acid precursors (and then the polyimides) of the present invention. Useful aliphatic diamines are 1,4-tetramethylenediamine, 1,5-pentamethylenediamine (PMD), 1,6-hexamethylenediamine (HMD), 1,7-heptamethylene diamine, 1,8-octamethylenediamine, 1,9-nonamethylenediamine, 1,10-decamethylenediamine (DMD), 1,11-undecamethylenediamine, 1,12-dodecamethylenediamine (DDD), 1,16-hexadecamethylenediamine. Useful cycloaliphatic diamines are para-amino cyclohexylmethane (PACM), isophorone diamine (IPD), and diaminocyclohexane (especially 1,4-diaminocyclohexane).

The diamines of the present invention may be used alone or in mixtures of two or more diamines. The diamines and the tetracarboxylic dianhydrides can be reacted by any conventional or non-conventional method to give a polyamic acid. Methods used to form polyamic acids are well known in the art and are not discussed herein.

The aromatic polyamic acid of the present invention can be prepared by polymerizing substantially equimolar amounts of the aforesaid aromatic tetracarboxylic acid and aromatic diamine components at an appropriate polymerization temperature, such as 175° C. or less, more preferably about 90° C. or less, and most preferably 50° C. or less. This reaction takes place for about one minute to several days in an inert organic solvent depending on the temperature. The aromatic tetracarboxylic acid and aromatic diamine components can be added either neat, as a mixture or as solutions to the organic solvent or the organic solvent may be added to the components.

It is not required that the aromatic tetracarboxylic acid and the aromatic diamine components be used in absolute equimolar amounts. In order to adjust the molecular weight, the mole ratio of the tetracarboxylic acid component to the diamine component can range from 0.90 to 1.10, but is typically 0.98 to 1.02.

In one embodiment, the polyamic acid solution contains from 5 to 40 weight percent, preferably 10 to 25 weight percent, of polyamic acid polymer.

Once the polyamic acid and doped polyaniline particles are appropriately inter-dispersed (to form a mixed polymer blend), the polyamic acid linkages can be subjected to cyclo-dehydration (a ring-closing reaction) to obtain a polyimide using a thermal conversion process. Optionally, chemical agents can be used to enhance the imidization reaction (e.g. dehydrating agents like acetic anhydride and catalysts like beta-picoline).

In one embodiment of the present invention, the mixed polymer blend mentioned above can then be cast onto a flat surface using a slot die to form a wet film. The wet film can then heated and dried to form a semi-cured sheet. The heating conditions range from generally 50, 70, 90, 110, 130, 150, 170, to 190° C. over a period of 10, 20, 30, 40, 50, or 60 minutes.

The semi-cured sheet can then processed through a curing oven where the film is stretched and additionally heated so that the polyamic acid is fully converted into a polyimide. The heating conditions range from 250, 300, 350, 400, 450, 500, 550, 600 and 650° C. over a period of 5, 10, 15, 20, 25, 30, 35 and 40 minutes.

In making the blend films of the present invention (i.e. films derived from a polyaniline component being dispersed in a polyimide component) it may be desirable to select a polyimide component derived from BPDA, PMDA, 4,4'-ODA and PPD monomers (i.e. monomers that when chemically reacted together form a polyimide component with a high glass transition temperature). On the other hand, it may be desirable to select a polyimide component derived from PMDA, ODPA, and RODA monomers (i.e. monomers that when chemically reacted together form a polyimide having a low glass transition temperature).

As used herein the term non-thermoplastic polyimide is used to describe a polyimide component that has a glass transition temperature greater than 300° C., preferably greater than 350° C., and most preferably greater than 400° C. As used herein the term thermoplastic polyimide is used to describe a polyimide component that has a glass transition temperature less than or equal to 300° C., preferably less than 250° C., and most preferably less than 220° C.

Non-thermoplastic polyimides, at certain monomer ratios, can be made to form a polyimide component (or combination with a doped polyaniline component) that has a coefficient of thermal expansion close to that of metal (particularly copper). This is ideal in flexible circuitry applications where low dissipation loss is an important property to achieve.

Thermoplastic polyimides, at certain monomer ratios, can be made to form a polyimide component that has adhesive properties. This is particularly useful in applications where the polyimide component, or the combination of the polyimide component and a doped polyaniline component, needs to be bonded to another material or itself.

As used herein, the term "self-adherable" polyimide is used to describe a film (either a pure polyimide or a blend film containing a polyimide component and a polyaniline component) that if exposed to high temperature and pressure, the film can adequately bond to itself. Typically, self-adherable films can require a temperature of at least 250, 275, 300, 325, 350, 375, and 400° C. and a pressure of at least 1, 10, 25, 50, 75, 100, 200, 300, 500, and 1000 (psi). Generally, bonding of self-adherable films occurs between 1, 3, 5, 10, 20, 30, and 60 minutes. Self-adherable films are generally useful as image transfer belts in color copying machines.

In one embodiment of the present invention the polyimide/polyaniline blended sheets have uniformly dispersed therein electrically conductive (doped) polyaniline particles so that the final film has a surface resistivity between any two of the following numbers, 10,000, $10^5$, $10^6$, $10^7$, $10^8$, $10^9$, $10^{10}$, $10^{11}$, $10^{12}$, $10^{13}$, and $10^{14}$ ohms per square.

In another embodiment, the substrate of the present invention has a total thickness in a range between and including any two of the following: 5, 8, 10, 15, 20, 25, 30, 35, 40, 45, 50, 55, 60, 65, 70, 75, 80, 85, 90, 95, 100, 105, 110, 115, 120, and 125 microns.

In another embodiment of the present invention, the polyimide/polyaniline blend films have a gloss factor between any two of the following numbers, 70, 75, 80, 85, 90, 95, 100, 105, 110, 115, and 120.

In yet another embodiment of the present invention, the blend films have a surface roughness, or also known as an Ra factor (microns) between any two of the following numbers, 0.05, 0.06, 0.07, 0.08, 0.09, 0.10, 0.11, 0.12, 0.13, 0.14 and 0.15. The film is also smooth enough to be used as an image transfer belt.

In one embodiment, the amount of doped polyaniline used in accordance with the present invention is in a range of from 5 to 60 weight percent (based upon the total weight of the doped polyaniline and polyimide), and depending upon the desired end use properties, can be used in a range from 10 to 20 percent. If doped polyaniline concentration is below 5 weight percent, the composite film may not show improved electrical conductivity compared to a pure polyimide. If the amount of doped polyaniline exceeds 60 weight percent (or 120 parts doped polyaniline per 100 parts polyimide), the film may have low dielectric strength, and will often have low mechanical strength. The weight ratio of doped polyaniline to polyimide can represented by the ratio A to B (A:B), where A is the doped polyaniline and B is the polyimide. In accordance with the present invention, A is a range between and including any two of the following weight parts: 5, 10, 15, 20, 25, 30, 35, 40, 45, 50, 55 and 60, and B is a range between and including any two of the following weight parts: 95, 90, 85, 80, 75, 70, 65, 60, 55, 50, 45, or 40. In one embodiment, the amount of doped polyaniline in the final composition is at least 10, 12, 14, 16, 18 or 20 weight percent of the entire final composition.

Ideally, the films of the present invention are produced with the necessary film drawing ratios during curing so that the volume resistivity (measured in ohm-cm) is equivalent to, or no more than two orders of magnitude from, the surface resistivity. If the film is drawn by too high a factor in the x-y plane of the film, the surface resistivity will often decrease. If however, the film is not drawn enough in the x-y plane, the polyimide may have too low a modulus.

The blend films of the present invention are substantially devoid of large electrically conductive particle, particles greater than 5.0 microns, however a small amount, less than 1.0 percent by weight may still exist.

The films of the present invention are generally well suited for use as an imaging transfer belt in high-speed color copying machines or can be useful as electronic substrates as well as "electrical resist layers" in flexible, or rigid, circuitry applications. These films are also ideally suitable as electrode materials for electrode cells, magnetic shields, electrostatic absorption films, anti-static materials, video recorder parts, and other electronic devices.

In another curing method, the polyamic acid/doped polyaniline mixed polymer blend is cast onto a metal foil. This is commonly called a cast-on-metal or cast-on-copper method. Here, the metal layer and the polymer cast onto the metal layer are heated so that the polyamic acid is cured to a polyimide. The result is a polymer-on-metal product.

The polymer blend film composites of either the stand-alone film, or the cast-on-metal product possess properties inherent to both the doped polyaniline (i.e. "electrical conductivity") and the polyimide resin (i.e. mechanical strength properties and chemical/thermal resistance). In the form of a stand-alone film, the composites of the present invention can be useful as an electronics-type substrate such as a base film for a flexible circuit laminate. The films of the present invention may also be stacked in a multi-layer printed circuit board as resist-type layer, or specifically a resistor layer. The films of the present invention may also be useful as a resist layer material in a "prepreg" material, sealing material for semiconductor package, a matrix for fiber reinforced composite material, membranes, or molding materials, or in similar type applications.

In one embodiment of the present invention, a metal layer is laminated on one side (or both sides) of the blended polyimide/doped-polyaniline film. Commonly, the metal layer is in the form of a metal foil made of copper, nickel, titanium, or alloys of different metals.

In another process, the blend film of the present invention can be cured and then metallized with a sputtering an electroplating operation, (or laminated to a metal foil) to form a composite blend film-metal layer laminate. In such a process, the blend film of the present invention can be first cured (i.e. the polyamic acid is cured to a polyimide) and then either sputter coated with a seed coat of metal and then electroplated, or simply laminated to an existing metal foil. In a sputtering operation, once a seed coat of metal is placed on either one side (or on both sides of the blend composite film) a thicker coating of metal can then be "plated-up" using an electroplating bath. Sputter and plating metalization operations, as well as cast-on-metal operations and metal foil lamination operations, are well known in the art and need not be fully described herein.

In other embodiments of the present invention, the polyimide/doped-polyaniline compositions are incorporated into liquids, pastes, films, or other laminate substrates and/or the like, to be used for screen printing, solution coating, spray coating or injecting molding. The compositions of the present invention can be cast or co-extruded onto a film or printed circuit board, particularly films containing at least one other electrically conductive layer, for use (ultimately) as an interior layer in a flexible circuit.

The substrates of the present invention can be incorporated into multilayer laminates, and/or incorporated into an integrated circuit device, such as, a level one packaging substrate for an integrated circuit. The substrates of the present invention can also be used in level 2 packaging as a substrate in a larger integrated circuit assembly. Optionally, the blend films of the present invention can be derived from a thermoplastic polyimide component and can be used to make a multilayer polyimide construction. In these film constructions, the thermoplastic electrically conductive blend film layer is used as the outer film layers of a three-layer laminate. A non-thermoplastic, high modulus polyimide (e.g. a polyimide derived from BPDA, PMDA, 4,4'-ODA, and PPD monomers) can be used as the inner layer. In addition, the inner layer polyimide may optionally be a blend of a polyimide component and a doped polyaniline component so that the inner layer is also electrically conductive. In another embodiment of the present invention, both the outer layers and the inner layer are derived from a thermoplastic polyimide component and a doped polyaniline component.

In one embodiment, a substrate in accordance with the present invention directly or indirectly supports (or protects) an integrated circuit die and further comprises a conductive pathway on a surface, and alternatively (or in addition), provides a conductive pathway within or through the substrate. In one embodiment, a substrate in accordance with the present invention is used as a component of an IC packaging composition, such as, a chip on lead ("COL")

package, a chip on flex ("COF") package, a lead on chip ("LOC") package, optoelectronic package, flat-wire applications, a multi-chip module ("MCM") package, a ball grid array ("BGA" or "µ-BGA") package, chip scale package ("CSP") or a tape automated bonding ("TAB") package. Alternatively, a substrate in accordance with the present invention can be used as a component of a wafer level integrated circuit packaging substrate comprising a conductive passageway having one or more of the following: a wire bond, a conductive metal, and a solder bump.

Substrates of the present invention can have a thickness in a range between and including any two of the following: 5, 8,10, 15, 20, 25, 30, 35, 40, 45, 50, 55, 60, 65, 70, 75, 80, 85, 90, 95, 100, 105, 110, 115, 120, and 125 microns. In one embodiment, at least a portion of the substrate is laminated to a metal layer.

In one embodiment, a substrate in accordance with the present invention is used as a component of an imaging transfer belt in a high-speed color copying machine. In other embodiments, a substrate in accordance with the present invention can be used as a multilayer (flexible or rigid) circuit board or as a component of an anti-static material.

In another embodiment, a substrate in accordance with the present invention is used as a self-adherable film for use as an image transfer belt (in a color copying machine) or the like, where self-adhesion can be induced by using heat, pressure or a combination thereof.

Substrates of the present invention can be incorporated into multilayer film structures, comprising an inner layer and two outer layers: i. wherein the outer layers are adjacent to the inner layer; ii. wherein at least 50, 60, 70, 80, 85, 90, 95, 98 or 100 weight percent of the outer layers are derived from a thermoplastic polyimide component and a doped polyaniline component; and iii. wherein at least 50, 60, 70, 80, 85, 90, 95, 98 or 100 weight percent of the inner layer is derived from a non-thermoplastic polyimide. Alternatively, the multilayer film can comprise an inner layer and two outer layers: i. wherein the outer layers are adjacent to the inner layer; ii. wherein at least 50, 60, 70, 80, 85, 90, 95, 98 or 100 weight percent of the outer layers are derived from a thermoplastic polyimide component and a doped polyaniline component; and iii. wherein at least 50, 60, 70, 80, 85, 90, 95, 98 or 100 weight percent of the inner layer is derived from a non-thermoplastic polyimide component and a doped polyaniline component.

EXAMPLES

The following EXAMPLES were conducted on the pilot scale using manufacturing grade equipment. To disperse the polyaniline particles in dimethylacetamide solvent, a Netzsch horizontal media mill, model LMZ-25, was used with a kinetic dispersion machine.

A slurry of polyaniline powder and dimethylacetamide solvent was first prepared using a 200-gallon kinetic dispersion, mixing machine. The powder was dumped into the solvent and dispersed for 45 minutes.

The subsequent media milling, through the LMZ-25 media mill, was accomplished by circulating the slurry from the kinetic dispersion machine through the media mill using a diaphragm pump. The LMZ-25 mill ground the particles by using internal moving baffles to pass the slurry over the media. The batch make-up recipe for each of the different EXAMPLES is listed below.

The particle size of the polyaniline slurries was measured using a Horiba LA-910 laser scattering particle size analyzer. The index of refraction was set to 1.24 for each measurement. The circulation pump and agitation set points were set to a value of three. The analyzer was filled with 100 ml of dimethylacetamide and 0.5 ml of doped polyaniline slurry was added (to the original 100 ml of dimethylacetamide) for each sample point.

Gloss factor measurements were made using a BYK Gardner Micro Tri-Gloss Meter set at a measurement angle of 85 degrees. Samples were at every 8 inches on a 40-inch wide strip. The five measurements were averaged and the average was recorded as the gloss factor value for each sample.

Surface roughness was measured using a SurfCom 570A system utilizing a one-micron tip and a light-load contact diamond stylus. The instrument measured the Ra roughness by taking two readings over a 24-millimeter distance. The two values were averaged and the average was recorded as the roughness Ra factor for each sample.

Surface resistivity measurements were taken using an Advantest R-8340A Ultra High Resistivity Meter utilizing a HR Resistivity Test Fixture and Base Plate. The unit was set to measure at 1000 volts surface with the "electrical discharge function" turned ON to remove residual static charge. Measurements were taken after 30 seconds of exposure to allow equilibration of the system charge. Measurements were taken every 8 inches across a 40-inch wide strip of film. The five measurements were averaged and the average was recorded as the surface resistivity for each sample.

Examples 1-6

In the following example, 1455 lbs. of dimethylacetamide was charged to a 200 gallon kinetic dispersion milling machine. Next, 47 lbs. of 85 percent aqueous phosphoric acid was added. Over 30 minutes, 98 pounds of polyaniline powder (in an Emeraldine salt form, "ES salt") was added and then additionally dispersed for 30 minutes.

After using kinetic dispersion, the slurry was tested to determine the average particle size of the slurry. The average particle size was between 8 and 20 microns depending on the time in which the sample was allowed to settle. 99.9% of the measured particles in the slurry was in the range of 18 to 25 microns.

Next, the slurry was circulated through the Netzsch horizontal media mill using diaphragm pump. The particle size coming from the discharge of the media mill was monitored over the next 100 hours. FIG. 1 shows the average particle size of the slurry over time.

The initial particle size of EXAMPLES 1-6 after 97 hours of milling through the media mill was 1.8 microns. The largest 99.9% of the particles was 4.3 microns. After 24 hours, under normal agitation, the particles had an average particle size of 2.0 microns. The largest 99.9% of the particles were 4.4 microns. Viscosity remained constant at about 0.2 poise.

The slurries were transferred to an agitated storage tank through a 25-micron filter. Periodic checking of the average particle size of the slurry showed no significant change (i.e. an increase in average particle size or gelling of the slurry) over a 24-hour period.

The slurries were blended with a solution of polyamic acid derived from 50 mole % RODA, 10 mole % PMDA and 40 mole % ODPA. The initial viscosity of the polyamic acid was 85 poise and weight percent solids was 22% solids in DMAc.

After addition of the polyaniline slurry to the polyamic acid, the viscosity of each EXAMPLE was raised to 750 poise by adding additional PMDA from a 6 weight percent solution. The final solution containing high viscosity polyamic acid and doped polyaniline was adequate for casting.

The mixed polymers of EXAMPLES 1-6 were cast onto a flat surface using a coat-hanger-style casting die forming different films. The surface of the film on the flat surface is known as the belt-side, the opposite side of the film is known as the air-side.

The films were heated from 40° C. to 150° C., over 45 minutes to produce semi-cured polyamic acid films. The semi-cured polyamic acid films were then passed through a high temperature oven to cure the polyamic acid to polyimide. The high temperature oven exposed the films to air temperatures between 575° C. and 650° C. for 20 minutes. The final films were greater than 99% polyimide containing dispersed therein, doped polyaniline particles at different volume loading levels where the polyaniline had an average particle size of about 2.0 microns. The following films were formed under varying conditions and had the following results.

| Properties | Example 1 | Example 2 | Example 3 | Example 4 |
|---|---|---|---|---|
| Polyaniline Loading (%) | 10.5 | 12.5 | 12.0 | 10.5 |
| Point Thickness (microns) | 83.3 | 76.7 | 76.7 | 80.3 |
| MD/TD Elongation (%) | 115.1 | 97.0 | 95.5 | 86.6 |
| MD/TD Tensile Strength (Kpsi) | 21.88 | 20.34 | 20.31 | 19.24 |
| MD/TD Modulus (Kpsi) | 401.94 | 377 | 429 | 466 |
| Gloss factor | 91.8 | 93.3 | 93.1 | 95.4 |
| Surface Resistivity (1000 V) 5 minutes after curing oven | 3.43E12 | 9.94E11 | 1.06E12 | 2.16E12 |
| Surface Resistivity (1000 V) 24 hours after curing oven | 2.61E11 | 1.07E11 | 1.64E11 | 2.55E11 |
| Roughness (Ra) microns | 0.09 | 0.12 | 0.11 | 0.07 |

| Properties | Example 5 | Example 6 |
|---|---|---|
| Polyaniline Loading (%) | 10.5 | 10.5 |
| Point Thickness (mil) | 80.5 | 80.5 |
| MD/TD Elongation (%) | 84.5 | 86.4 |
| MD/TD Tensile Strength (Kpsi) | 18.17 | 18.06 |
| MD/TD Modulus (Kpsi) | 348 | 354 |
| Gloss Factor | 96.3 | 95.4 |
| Surface Resistivity (1000 V) 5 minutes after curing oven | 1.74E12 | 3.25E12 |
| Surface Resistivity (1000 V) 24 hours after curing oven | 1.05E11 | 2.46E11 |
| Roughness (Ra) microns | 0.09 | 0.10 |

Comparative Examples 1-2

In the following COMPARATIVE EXAMPLES, 805 lbs. of dimethylacetamide was charged to a 200-gallon kinetic dispersion, milling machine. Next, 16.9 lbs. of 85 percent aqueous phosphoric acid (dopant) was added. Over 30 minutes, 52.5 pounds of polyaniline powder in the ES salt form was added and then additionally dispersed for 30 minutes.

After milling, the slurry was tested to determine the average particle size of the slurry. In these COMPARATIVE EXAMPLES, the average particle size of the polyaniline slurry was between 8 to 10 microns depending on the sample taken and the time in which the sample was allowed to settle prior to being analyzed. 99.9% of the measured particles in the slurry were in the range of 18 to 25 microns.

Next, the slurry was circulated through the Netzsch horizontal media mill using diaphragm pump. The particle size coming from the discharge of the media mill was monitored over the next 20 hours until the average particle size of the slurry was about 7.5 microns and 99.9% of the particles were smaller than 20 microns. The slurry was transferred without any filters.

The following slurry was mixed with polyamic acid, cast and cured in the same manner as the EXAMPLES. The following film data was obtained.

| Properties | Comparative Ex. 1 | Comparative Ex. 2 |
|---|---|---|
| Polyaniline Loading (%) | 8.1 | 9.0 |
| Point Thickness (microns) | 85.9 | 80.2 |
| MD/TD Elongation (%) | 80.1 | 65.7 |
| MD/TD Tensile Strength (Kpsi) | 17.9 | 16.55 |
| MD/TD Modulus (Kpsi) | 368 | 385 |
| Gloss Factor | 65.7 | 63.2 |
| Surface Resistivity (1000 V) 5 minutes after curing oven | 2.49E13 | 1.82E13 |
| Surface Resistivity (1000 V) 24 minutes after curing oven | 3.0E12 | 1.5E12 |
| Roughness (Ra) microns | 0.18 | 0.19 |

The results of these two COMPARATIVE EXAMPLES illustrate that when the average particle size of the polyaniline filler is about 7.5 microns, the films produced have a lower gloss factor and higher roughness.

Comparative Example 3

The following COMPARATIVE EXAMPLE was using 358.8 (g) of DMAc, 13.38 of 85% aqueous phosphoric acid, and 28.0 grams of polyaniline powder (ES salt). The three components were milled in a high shear laboratory-milling machine, for 300 minutes, drawing 1.8 kilowatts of power.

The viscosity of the slurry, at an average particle size of 1.8 microns, was about 1 poise. The slurry was milled down further to an average particles size of less than 0.5 microns. As the average particle size of the slurry decreased to about 0.01 microns, the viscosity of the slurry dramatically increased. The viscosity at this size range was measured to be about 2,000 poise. A particle size analysis at this stage revealed that the slurry contained only about 1 to 3 percent of the particles in the 500 to 1000 micron size range. The physical character of the slurry resembled a gel, or gelatinous liquid.

A film was produced using the slurry above (the slurry originally having an initial average particle size of about 0.01 microns). The viscosity of the slurry was so high some additional solvent was added to mix the slurry with polyamic acid to cast a film. A particle size analysis of the slurry at this stage showed that 99.9 percent of the particles in this slurry were smaller than about 534.3 microns and the final diluted viscosity was about 4,500 poise. COMPARATIVE EXAMPLE 3 produced a polyimide/polyaniline blend film having a Ra roughness number of about 0.89 microns and a gloss factor of about 55.0.

What is claimed is:

1. An electrically conductive, polyimide based substrate comprising:
   a polymeric blend of at least a polyimide component and a polyaniline component, the polyaniline component being:

a. present from 5 to 40 weight percent of the total substrate, and
b. derived from a liquid dispersion of doped or un-doped polyaniline particles having an average particle size from 0.5 to less than 5 microns, to provide at least one substrate surface having:
  i. a surface electrical resistivity from 10,000 to $10^{14}$ ohms per square,
  ii. a surface gloss factor from 70 to 120, and
    iii. a surface roughness, Ra factor (microns), from 0.05 to 0.15.

2. A substrate in accordance with claim 1, wherein the thickness of the substrate is from 5 to 125 microns.

3. A substrate in accordance with claim 1, wherein the substrate is created in part by forming a doped polyaniline dispersion and subjecting the dispersion to a shearing force over a sufficient time to reduce the doped polyaniline particles to an average size from 4.9 to 0.5 microns and then mixing the doped polyaniline dispersion with a polyimide precursor solution.

4. A substrate in accordance with claim 1, wherein at least a portion of the substrate is also laminated to a metal.

5. A substrate in accordance with claim 1, wherein the polyimide component is derived from a polyamic acid precursor created at least in part by contacting one or more dianhydride components with one or more diamine components, the dianhydride component being selected from a group consisting of: pyromeiritic dianhydride, 4,4'-oxydiphthallc anhydride, bis(3,4-dicarboxyphenyl) sulfone dianhydride, 2,2-bis(3,4-dicarboxyphenyl) 1,1,1,3,3,3,-hexafluoropropane dianhydride (6FDA), 2,2'-bis[4-(3,4-dicarboxyphenoxy)phenyl]propane dianhydride, 3,3',4,4'-benzophenonetetracarboxylic dianhydride, 3,3',4,4'-biphenyltetracarboxylic dianhydride and combinations thereof.

6. A substrate in accordance with claim 1, wherein the polyimide component is derived from a polyamic acid precursor created at least in part by contacting one or more dianhydride components with one or more diamine components, the diamine component being selected from a group consisting of: 1,4-diaminobenzene (PPD), 1,3-diaminobenzene (MPD), 4,4'-diaminodiphenyl ether (4,4'-ODA), 3,4'-diaminodiphenyl ether (3,4'-ODA), 1,3-bis-(4-aminophenoxy) benzene (APB-134 or RODA), 1,3-bis-(3-aminophenoxy) benzene (APB-133), 2,2-bis -[4-(4-aminophenoxy)phenyl]propane (BAPP), bis-(4-(4-aminophenoxy)phenyl sulfone (BAPS), 4,4'-bis(3-aminophenoxy)diphenylsulfone (m-BAPS), 4,4'-bis-(aminophenoxy)biphenyl (BAPB), bis(4-[4-aminophenoxy]phenyl) ether (BAPE), ), 1,6-hexamethylenediamine (HMD), 2,2'-bis-(4-aminophenyl) 1,1,1,3,3-hexafluoro propane (6F diamine), and combinations thereof.

7. A substrate in accordance with claim 1, wherein the polyaniline component is selected from the group consisting of Emeraldine base polyaniline, Emeraldine salt polyaniline, leucoEmeraldine polyaniline, nigraniline polyaniline, and pernigraniline polyaniline.

8. A substrate in accordance with claim 1, wherein the polyanline component is derived from an aniline component selected from the group consisting of aniline, alkylaniline and alkoxyaniline.

9. A substrate in accordance with claim 1, wherein the polyaniline component is dispersed in a polar solvent selected from a group consisting of: dimethylacetamide (DMAc), N-methylpyrrolidinone (NMP), gamma-butyrolactone, N,N'-dimethyl-formamide (DMF), dimethyl sulfoxide (DMSO), tetramethyl urea (TMU), N,N-dialkylcarboxylamides, N,N-diethylformamide, N,N-diethylacetamide, dimethylsulfoxide, N-cyclohexyl-2-pyrrolidone, dimethylsulfone, hexamethylphosphoramide, tetramethylenesulfone, diglyme, and pyridine.

10. A substrate in accordance with claim 9, whereIn the polyaniline component is dispersed in a mixture of a first solvent and a second solvent, wherein the first solvent has a surface tension between 34 mN/m and 42 mN/m, and wherein the second solvent has a surface tension either between and including 20 and 33.5 mN/m or between and including 42 and 500 mN/m.

11. A substrate in accordance with claim 9, wherein the polyaniline component is dispersed in a mixture of a first solvent and a second solvent wherein the second solvent is selected from the group consisting of water, alcohols, ethers, and ketones.

12. A substrate in accordance with claim 1, wherein the polyaniline component is doped with a protic acid having an acid dissociation constant (pKa) equal to or less than 4.8.

13. A substrate in accordance with claim 1, wherein the polyaniline component is doped with an acid selected from a group consisting of hydrochloric acid, sulfuric acid, nitric acid, phosphoric acid, hypophosphoric, phosphonic acids, hydrofluoroboric acid, hydrofluorophosphoric acid, hydrochloric acid, aliphatic acids, aromatic acids, alicyclic acids, and polybasic acids.

14. A substrate in accordance with claim 1, said substrate comprising all or part of an imaging transfer belt in a high-speed color copying machine.

15. A substrate in accordance with claim 1, said substrate being a component of a multilayer flexible or rigid circuit board.

16. A substrate in accordance with claim 1, said substrate being a component of an anti-static blanket.

17. A substrate in accordance with claim 1, said substrate being a component of a circuit package.

18. A single layer substrate in accordance with claim 1, further comprising a filler.

19. A single layer substrate in accordance with claim 1, further comprising a filler selected from the group consisting of metal, metal oxides, carbon fibers, graphite, and semiconductor powders.

20. A substrate in accordance with claim 1, wherein the substrate is a component of a packaging composition, the packaging composition being a chip on lead ("COL") package, a chip on flex ("COF") package, a lead on chip ("LOC") package, a multi-chip module ("MCM") package, optoelectronic package, flat-wire applications, a ball grid array ("BGA" or "μ-BGA") package, chip scale package ("CSP") or a tape automated bonding ("TAB") package.

21. A substrate in accordance with claim 1, wherein the substrate is a component of a integrated circuit packaging substrate comprising a conductive passageway, said passageway comprising one or more members of the following group: a wire bond, a conductive metal, and a solder bump.

22. A substrate in accordance with claim 1, wherein the substrate is a self-adherable film using heat, pressure or a combination thereof.

23. A substrate in accordance with claim 1, wherein the substrate is a seif-adherable film and wherein the film is used as an image transfer belt in a color copying machine.

* * * * *

UNITED STATES PATENT AND TRADEMARK OFFICE
CERTIFICATE OF CORRECTION

PATENT NO.       : 7,316,791 B2                                           Page 1 of 1
APPLICATION NO.  : 10/748940
DATED            : January 8, 2008
INVENTOR(S)      : Bernhard Wessling, Brian C. Auman and Paul Arthur Meloni It is certified that error appears in the above-identified patent and that said Letters Patent is hereby corrected as shown below:

Column 20, Claim 10, Line 1 "whereIn" should read -- wherein --.

Column 20, Claim 23, Line 2 "seif-adherable" should read -- self-adherable --.

Signed and Sealed this

Thirteenth Day of May, 2008

JON W. DUDAS
*Director of the United States Patent and Trademark Office*